United States Patent [19]
Khajezadeh

[11] 4,106,048
[45] Aug. 8, 1978

[54] INTEGRATED CIRCUIT PROTECTION DEVICE COMPRISING DIODE HAVING LARGE CONTACT AREA IN SHUNT WITH PROTECTED BIPOLAR TRANSISTOR

[75] Inventor: Heshmat Khajezadeh, Somerville, N.J.

[73] Assignee: RCA Corp., New York, N.Y.

[21] Appl. No.: 791,424

[22] Filed: Apr. 27, 1977

[51] Int. Cl.² ........................................... H01L 27/02
[52] U.S. Cl. .................................... 357/40; 357/13; 357/34; 357/65; 361/56; 361/91
[58] Field of Search ...................... 357/13, 34, 40, 65; 361/56, 91

[56] References Cited
U.S. PATENT DOCUMENTS

| | | | |
|---|---|---|---|
| 4,017,882 | 4/1977 | Kannam et al. | 357/34 |
| 4,053,336 | 10/1977 | Grundy et al. | 357/40 |

*Primary Examiner*—Joseph E. Clawson, Jr.
*Attorney, Agent, or Firm*—H. Christoffersen; Sanford J. Asman

[57] ABSTRACT

A protection device for integrated circuits used on television sets is described which protects the devices against damage of the type caused by kinescope arcing.

The protection device described comprises a diode having a first region of the same conductivity type as the emitter region of the protected bipolar transistor and a second region of opposite conductivity type to the first region which second region contacts only the collector of the protected transistor. An electrode contacts the first region of the diode over a much larger area than the area the same electrode makes contact to the emitter of the protected bipolar transistor in order to allow large transient currents to go to ground through the diode rather than through the transistor thereby protecting the transistor from destruction due to transient discharges.

9 Claims, 4 Drawing Figures

INTEGRATED CIRCUIT PROTECTION DEVICE COMPRISING DIODE HAVING LARGE CONTACT AREA IN SHUNT WITH PROTECTED BIPOLAR TRANSISTOR

The present invention relates to a protection device for an integrated circuit.

Integrated circuit semiconductor devices are currently used in all television circuit functions and have replaced all tubes except for the picture tube in most television sets currently being manufactured. A problem which has been discovered in using integrated circuits in television sets is that the kinescope is subject to high voltage arcing which occurs at unpredictable times. When a high voltage transient resulting from a kinescope arc causes a large current flow through an emitter-base junction of a transistor, the transistor's beta can be degraded greatly. Such degradation is permanent in nature.

In color television sets, it has been noticed that the output transistors of the chroma demodulator integrated circuits, the circuits which precede the output power transistors in feeding signals to the kinescope, are often damaged by kinescope arcing. Their damage results in the partial or complete loss of one or more colors from the picture.

In order to prevent damage to integrated circuit devices used in television circuits it is necessary to provide protection devices capable of allowing a large current flow, resulting from a kinescope arc, to be dissipated without forcing a large amount of current through an emitter-base junction of a transistor.

Figure 1:
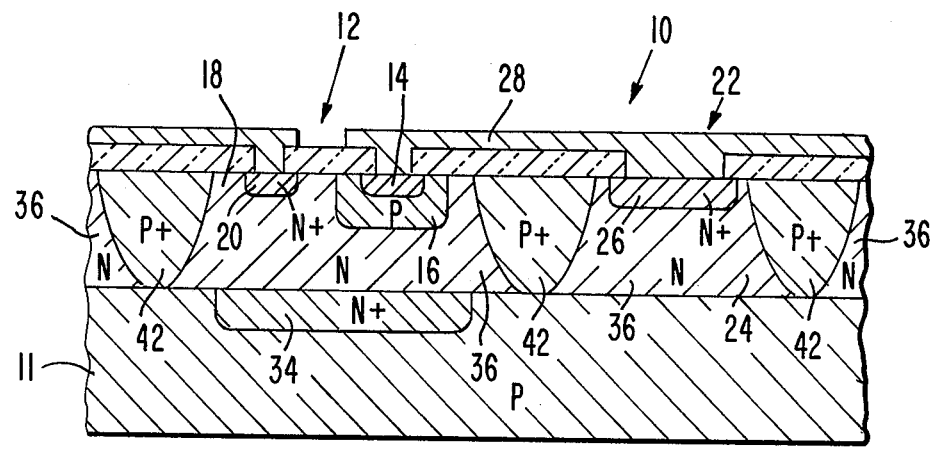
FIG. 1 is a cross section of an integrated circuit device including the protection device of the present invention.

Referring to FIG. 1, a portion of an integrated circuit device such as a chroma demodulator is shown. The device 10 comprises at least one output transistor 12, in this case an NPN transistor having an emitter 14, a base 16 and a collector 18 with a contact 20 associated with it. The integrated circuit device 10 further comprises the protection device 22 of the present invention. The protection device comprises a large diode having an N type cathode 24 and a large area N+ type contact 26. A conductive layer 28 is used to make electrical contact between the emitter 14 of the transistor 12 and the N+ contact 26 of the protection device 22.

In order for the protection device 22 to operate effectively, it is necessary that it have a much larger area than the emitter 14. Thus, any large current surges, such as those which result from kinescope arcing can easily pass through the protection device 22 to the substrate 11 which is held at ground potential. In the preferred embodiment of the invention the area of the N+ contact 26 is on the order of 16 square mils which is about 30 times the surface area of the emitter 14. Accordingly, when a large transient occurs, it will pass through the protection device 22 rather than through the emitter-base junction of the transistor 12.

Figure 2:
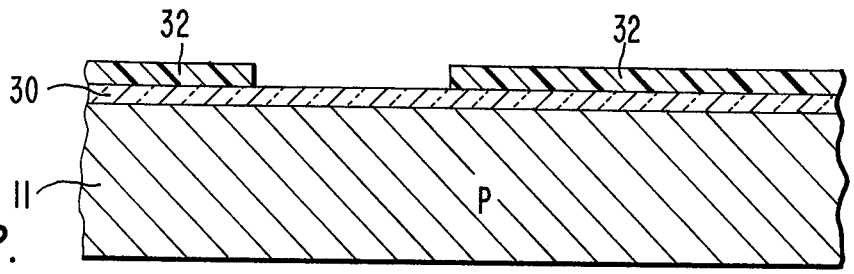
FIGS. 2-4 illustrate the method of manufacturing the device of FIG. 1.

In order to manufacture the integrated circuit 10 including the protection device 22 one starts with a P type substrate 11 as shown in FIG. 2. An oxide layer 30 is formed on the surface of the substrate 11 by any generally known method such as by the thermal oxidation of silicon which may be accomplished by heating the substrate 11 to between 800° and 1200° C in an oxidizing atmosphere containing a small quantity of steam and HCl. Next, a layer of photoresist 32 is applied over the oxide layer and is defined in accordance with standard photolithographic processes to expose a portion of the oxide layer 30 which is then removed by etching in a suitable etchant such as buffered hydrofluoric acid.

Figure 3:
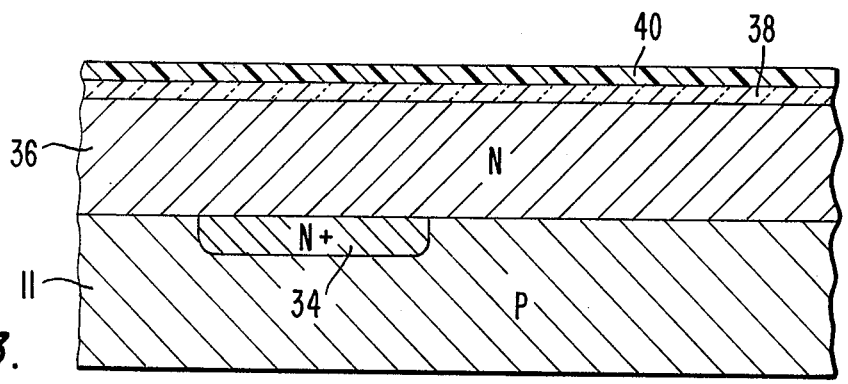

Referring to FIG. 3 an N+ region 34 is formed in the substrate by diffusing a donor impurity, such as antimony, into the opening made in the oxide layer 30 which is then removed. Following the diffusion of an N+ region 34 and then removal of the balance of the oxide layer 30, an N type epitaxial layer 36 is grown over the surface of the P type substrate 11. Then, an oxide layer 38 is formed over the surface of the epitaxial layer 36. Another layer of photoresist 40 is applied over the surface of the oxide layer 38, and the photoresist layer 40 is defined by a photomask (not shown). The developed photoresist is used as a mask for removing portions of the oxide layer 38 by an etch comprising buffered hydrofluoric acid over the regions where P+ areas 42 are diffused.

Figure 4:
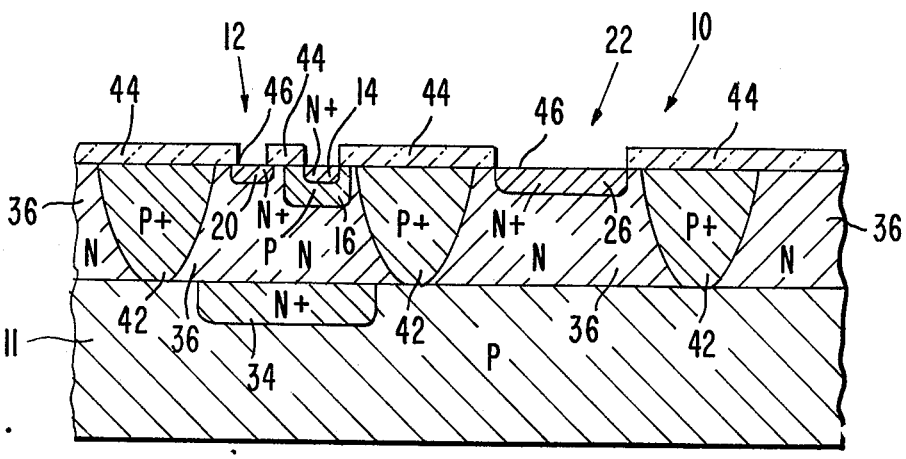

Referring now to FIG. 4 the device 10 is shown following the introduction of acceptor type impurities which are used to form the base region 16. The impurities used to form the base region 16 are diffused through openings in an oxide layer (not shown) in the same manner as other impurities which were previously introduced.

Next, the oxide layer used as the mask for forming the base region 16 is stripped and another oxide layer 44 is formed over the surface of the device 10. The oxide layer 44 is defined using a fourth photomask (not shown) to provide openings 46 through which donor impurities are diffused to form the collector 20 and emitter 14 of the transistor 12 and the N+ contact 26 of the protection devices 22.

Finally a metallization layer 28 (shown in FIG. 1) is applied over the entire surface of the device 10 and a fifth layer of photoresist and photomask are used to define the metallization layer 28 into the conductors of the device 10.

What is claimed is:

1. An integrated circuit protection device for a transistor having a collector region, a base region, and an emitter region, said emitter region forming with said base region a PN junction comprising:
    (a) a diode having one electrode connected to a first area on a first region of said diode, said electrode also being connected to a second area on said emitter, said first region having the same conductivity type as said emitter;
    (b) a second region of the diode having opposite conductivity type to said first region, a PN junction formed between said first region and said second region of said diode, and means for making electrical contact to said second region, said first area being much larger than said second area.

2. The device of claim 1 wherein said transistor and said diode are formed in a single substrate.

3. The device of claim 2 wherein said substrate is of the same conductivity type as the base of said transistor.

4. The device of claim 3 wherein an epitaxial layer formed on said substrate and of opposite conductivity type to said substrate comprises said second region of said diode.

5. The device of claim 4 wherein said base of said transistor comprises a well formed in said substrate.

6. The device of claim 5 wherein said first region of said diode and said base are separated by a highly conductive region of the same conductivity type as said second region of said diode.

7. The device of claim 6 further comprising an electrical contact to said first region of said diode.

8. The device of claim 7 wherein said electrical contact to said first region of said diode comprises a highly doped portion of said first region of said diode.

9. The device of claim 8 wherein said first area is at least 30 times said second area.

* * * * *